US006242289B1

(12) United States Patent
Nakajima et al.

(10) Patent No.: US 6,242,289 B1
(45) Date of Patent: Jun. 5, 2001

(54) METHOD FOR PRODUCING SEMICONDUCTOR DEVICE

(75) Inventors: Setsuo Nakajima, Kanagawa; Shunpei Yamazaki, Tokyo; Naoto Kusumoto; Satoshi Teramoto, both of Kanagawa, all of (JP)

(73) Assignee: Semiconductor Energy Laboratories Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/292,016

(22) Filed: Apr. 15, 1999

Related U.S. Application Data (60) Continuation of application No. 08/893,550, filed on Jul. 11, 1997, now Pat. No. 5,937,282, which is a division of application No. 08/525,167, filed on Sep. 8, 1995, now Pat. No. 5,712,191.

(51) Int. Cl.[7] .................................................. H01L 21/00
(52) U.S. Cl. ......................... 438/151; 438/153; 438/250; 438/410
(58) Field of Search .................................. 438/151, 153, 438/250, 410

(56) References Cited

U.S. PATENT DOCUMENTS

| | | | |
|---|---|---|---|
| 4,177,372 | 12/1979 | Kotera | 117/39 |
| 4,316,074 | 2/1982 | Daly | 438/486 |
| 4,330,363 | 5/1982 | Biegesen | 117/54 |
| 4,406,709 | 9/1983 | Celler | 117/44 |
| 4,592,799 | 6/1986 | Hayafuji | 117/45 |
| 5,147,826 | 9/1992 | Liu et al. | 219/121.6 |
| 5,403,772 | 4/1995 | Zhang | 437/101 |
| 5,488,000 | 1/1996 | Zhang | 437/21 |
| 5,521,107 | 5/1996 | Yamazaki et al. | 437/42 |
| 5,563,427 | 10/1996 | Yudasaka et al. | 437/27 |
| 5,569,610 | 10/1996 | Zhang et al. | 437/21 |
| 5,591,668 | 1/1997 | Maegawa | 437/174 |
| 5,604,360 | 2/1997 | Zhang et al. | 257/72 |
| 5,608,232 | 3/1997 | Yamazaki et al. | 257/66 |
| 5,620,906 | 4/1997 | Yamaguchi et al. | 438/162 |
| 5,712,191 | 1/1998 | Nakajima et al. | 437/174 |

FOREIGN PATENT DOCUMENTS

| | | |
|---|---|---|
| 61-251115 | 11/1986 | (JP) . |
| 2-140915 | 5/1990 | (JP) . |

OTHER PUBLICATIONS

S. Caune et al., "Combined CW Laser and Furnace Annealing of Amorphous Si and Ge in Contact With Some Metals", Applied Surf. Sci. 36 (1989) pp. 597–604.

Primary Examiner—Richard Elms
Assistant Examiner—Pho Luu
(74) Attorney, Agent, or Firm—Eric J. Robinson; Nixon Peabody LLP (57) ABSTRACT

In producing a thin film transistor, after an amorphous silicon film is formed on a substrate, a nickel silicide layer is formed by spin coating with a solution (nickel acetate solution) containing nickel as the metal element which accelerates (promotes) the crystallization of silicon and by heat treating. The nickel silicide layer is selectively patterned to form island-like nickel silicide layer. The amorphous silicon film is patterned. A laser light is irradiated while moving the laser, so that crystal growth occurs from the region in which the nickel silicide layer is formed and a region equivalent to a single crystal (a monodomain region) is obtained.

20 Claims, 9 Drawing Sheets

IMPURITY ION IMPLANTATION AND LASER LIGHT IRRADIATION

LASER LIGHT IRRADIATION MOVING DIRECTION (SCANNING DIRECTION)

FIG. 6B

LASER LIGHT IRRADIATION MOVING DIRECTION (SCANNING DIRECTION)

FIG. 7A

LASER LIGHT IRRADIATION MOVING DIRECTION (SCANNING DIRECTION)

METHOD FOR PRODUCING SEMICONDUCTOR DEVICE

This application is a Continuation application of Ser. No. 08/893,550 filed Jul. 11, 1997, now U.S. Pat No. 5,937,282, which itself is a Divisional application of Ser. No. 08/525,167, filed Sep. 8, 1995, now U.S. Pat. No. 5,712,191.

BACKGROUND OF THE INVENTION

1. Field of the Invention

The present invention relates to a method for producing a semiconductor device using a crystalline thin film semiconductor.

2. Description of the Related Art

Recently, much attention is paid on a transistor constructed of a thin film semiconductor formed on a glass or quartz substrate. Such a thin film transistor (TFT) is constructed of a thin film semiconductor having a thickness of several hundreds to several thousands of angstroms (Å), formed on the surface of a glass substrate or a quartz substrate (insulated gate field effect transistor).

TFTs are used in an application field such as the field of an active matrix type liquid crystal display device. An active matrix type liquid crystal display device has several hundred thousands of pixels arranged in a matrix, and TFTs are provided to each of the pixels as switching elements to realize a high quality image display. Practically available TFTs designed for active matrix type liquid crystal display devices utilize thin films of amorphous silicon.

However, TFTs based on thin films of amorphous silicon are still inferior in performance. If a higher display function is required as a liquid crystal display of an active matrix type, the characteristics of TFTs utilizing an amorphous silicon film are too low to satisfy the required level.

Further, it is proposed to fabricate an integrated liquid crystal display system on a single substrate by using TFTs to realize not only the pixel switching, but also the peripheral driver circuit. However, a TFT using an amorphous silicon thin film cannot constitute a peripheral driver circuit because of its low operation speed. In particular, a basic problem is that a CMOS circuit is unavailable from a amorphous silicon thin film. This is due to the difficulty in implementing a practical P-channel type TFT by using amorphous silicon thin film (i.e., the TFT using an amorphous silicon thin film is practically unfeasible due to its too low performance).

Another technology is proposed to integrate other integrated circuits and the like for processing or recording image data, etc., on a single substrate together with the pixel regions and the peripheral driver circuits. However, a TFT using a thin film of amorphous silicon is too inferior in characteristics to constitute an integrated circuit capable of processing image data.

On the other hand, there is a method for manufacturing a TFT using a crystalline silicon film which is far superior in characteristics as compared with the one using a thin film of amorphous silicon. The method for manufacturing TFT comprises the steps of: forming an amorphous silicon film; and modifying the resulting amorphous silicon film into a crystalline silicon film by subjecting the amorphous silicon film to heat treatment or to laser irradiation. The crystalline silicon film obtained by crystallizing an amorphous silicon film generally yields a polycrystalline structure or a microcrystalline structure.

As compared with a TFT using an amorphous silicon film, a TFT having far superior characteristics can be obtained by using a crystalline silicon film. In mobility which is one of the indices for evaluating a TFT, a TFT using amorphous silicon film yields 0.5 to 1 $cm^2$/Vs or lower (in an N-channel TFT), but a TFT using a crystalline silicon film has a mobility of about 100 $cm^2$/Vs or higher in an N-channel TFT, or about 50 $cm^2$/VS or higher for a P-channel TFT.

The crystalline silicon film obtained by crystallizing an amorphous silicon film has a polycrystalline structure. Hence, various problems arise due to the presence of grain boundaries. For example, carriers which move through the grain boundaries greatly limit the withstand voltage of the TFT. The change or degradation in characteristics which occurs in high speed operation is another problem. Further, the carriers which move through the grain boundaries increase the OFF current (leak current) when the TFT is turned off.

In manufacturing a liquid crystal display device of an active matrix type in a higher integrated constitution, it is desired to form not only the pixel region but also the peripheral circuits on a single glass substrate. In such a case, it is required that the TFTs provided in the peripheral circuit operate a large current to drive several hundred thousands of pixel transistors arranged in the matrix.

A TFT having a wide channel width must be employed to operate a large current. However, even if the channel width should be extended, a TFT using a crystalline silicon film cannot be put into practice because of the problems of withstand voltage. The large fluctuation in threshold voltage is another hindrance in making the TFT practically feasible.

A TFT using a crystalline silicon film cannot be applied to an integrated circuit for processing image data because of problems concerning the fluctuation in threshold voltage and the change in characteristics with passage of time. Accordingly, a practically feasible integrated circuit based on the TFTs which can be used in place of conventional ICs cannot be realized.

To overcome the problems concerning TFTs using a thin film of amorphous silicon or TFTs using a thin film of polycrystalline or microcrystalline silicon, a method for manufacturing a TFT using a particular region is known in the art. The method for manufacturing a TFT comprises steps of forming a region which can be regarded as a single crystal in a particular region of an amorphous silicon thin film, and then forming a TFT utilizing this particular region. By employing the method, a TFT which exhibits characteristics well comparable to those of a transistor formed on a single crystal silicon wafer (i.e., a MOS type transistor) can be obtained.

Figure 2A:
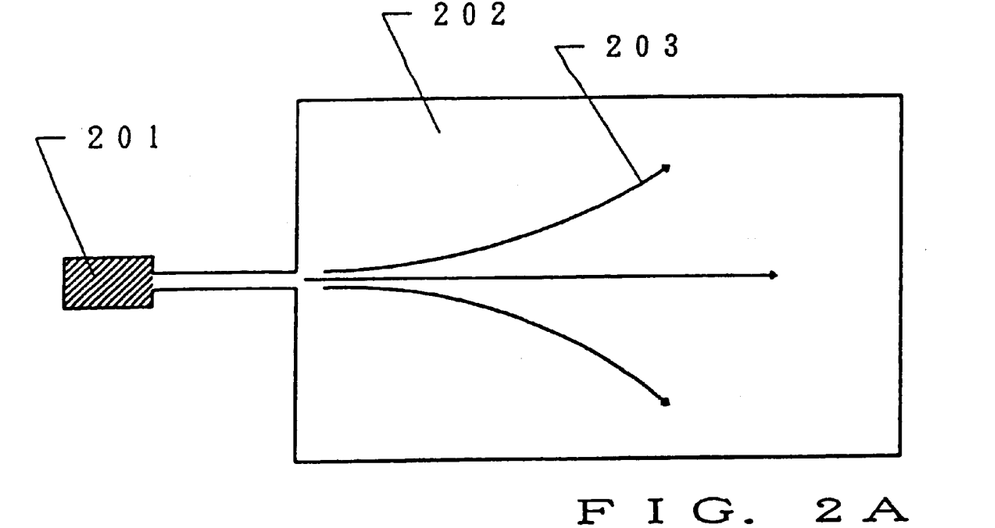
FIGS. 2A and 2B show steps for manufacturing crystalline region according to a conventional method.

The above technology is disclosed in JP-A-Hei-2-140915 (the term "JP-A-" signifies "Unexamined Published Japanese Patent Application"). In FIG. 2A, the method comprises the steps of forming a region 201 provided as a seed crystal, and then applying heat treatment to perform crystal growth from the region 201 as the seed crystal in a direction of an arrow 203 to finally crystallize a region of amorphous silicon patterned into a shape 202.

Figure 2B:
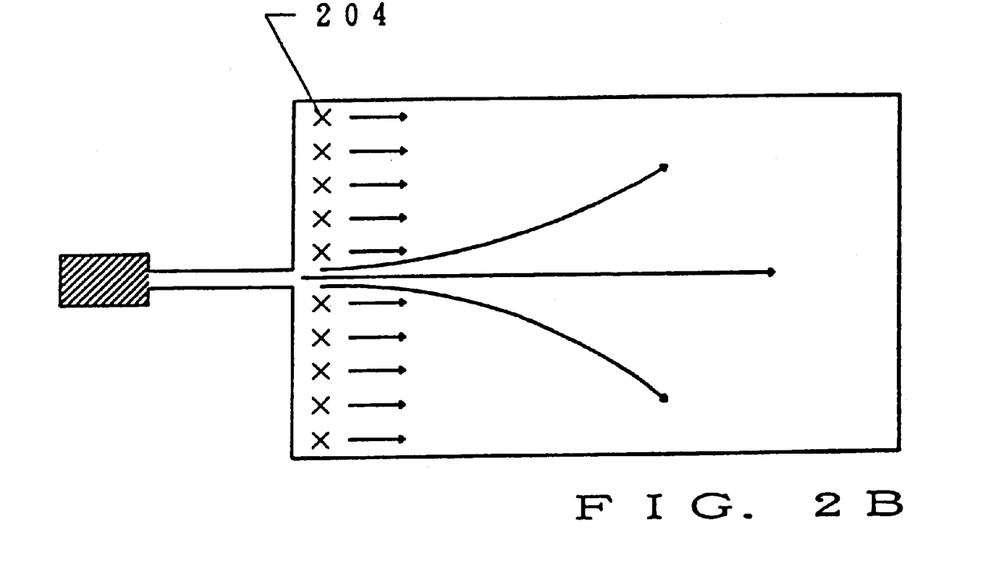

However, in FIG. 2A according to a conventional method, crystal growth occurs from a region 204 simultaneously with the crystal growth that is initiated from the region 201 in which the amorphous silicon patterned into the shape 202 is used as the seed crystal. That is, when the method of FIGS. 2A and 2B is employed, unwanted seeds of crystal growth is formed additionally in the region 204 to allow crystal growth to occur in plural modes. Thus, a polycrystalline state comprising internal crystal grain boundaries is obtained. In heat treatment, crystal growth cannot be performed within a desired area.

SUMMARY OF THE INVENTION

An object of the present invention is to provide a method which efficiently forms a region equivalent to (corresponding to) a single crystal in an amorphous silicon film provided as a starting film on a substrate having an insulating surface. Another object of the present invention is to provide a thin film transistor (TFT) that is free from the influence of grain boundaries. Another object of the present invention is to provide a TFT having a high withstand voltage and which is capable of operating a large current. Another object of the present invention is to provide a TFT whose characteristics do not undergo degradation or fluctuation with passage of time. Another object of the present invention is to provide a TFT whose performance is well comparable to that of a single crystal semiconductor.

According to one aspect of the present invention, there is provided a method comprising the steps of: forming selectively a layer of a metal element which accelerates (promotes) the crystallization of silicon in contact with the surface of the amorphous silicon film; and forming a region equivalent to a single crystal by irradiating a laser light to the amorphous silicon film while moving the laser light in the direction for increasing the area of the amorphous silicon film, wherein the laser light is irradiated while heating the amorphous silicon film.

In another aspect of the present invention, there is provided a method comprising the steps of: forming selectively a layer of a metal element which accelerates the crystallization of silicon in contact with the surface of the amorphous silicon film; patterning the amorphous silicon film in such a shape that the patterned area gradually increases from the region in contact with the layer of the metal element; and forming a region equivalent to a single crystal by irradiating laser light while moving the laser light in the direction for increasing the patterned area, wherein the laser light is irradiated while heating the amorphous silicon film. The amorphous silicon film is formed by plasma CVD, low pressure thermal CVD, etc., on a substrate having an insulating surface such as a glass substrate or a quartz substrate.

The metal element for accelerating (promoting) the crystallization of silicon is at least one selected from the group consisting of Fe, Co, Ni, Ru, Rh, Pd, Os, Ir, and Pt.

The metal layer can be formed selectively by forming a layer of the metal element on the surface of the amorphous silicon film and then patterning the resulting layer of the metal element. The layer of the metal element (which may be a layer containing the metal element) can be formed most preferably by forming a layer of nickel silicide on the surface of the amorphous silicon film by a method which comprises the steps of, coating the surface of the amorphous silicon film with a solution containing the metal element and then performing heat treatment.

Figure 1A:
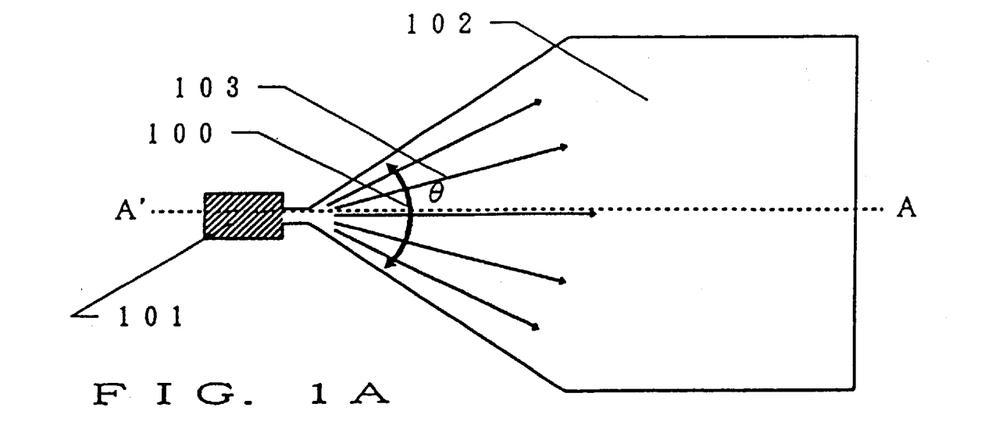
FIGS. 1A to 1C show steps for manufacturing a region equivalent to single crystal.

In the above constitution, the step of "patterning the amorphous silicon film in such a shape that the patterned area gradually increases from the region in contact with the layer of the metal element" corresponds to a step of patterning an amorphous silicon film into a shape 102 in FIG. 1A. In FIG. 1A, the area of the shape 102 increases with an angle of θ from the portion to which a layer 101 is formed in contact with the metal element.

Figure 1B:
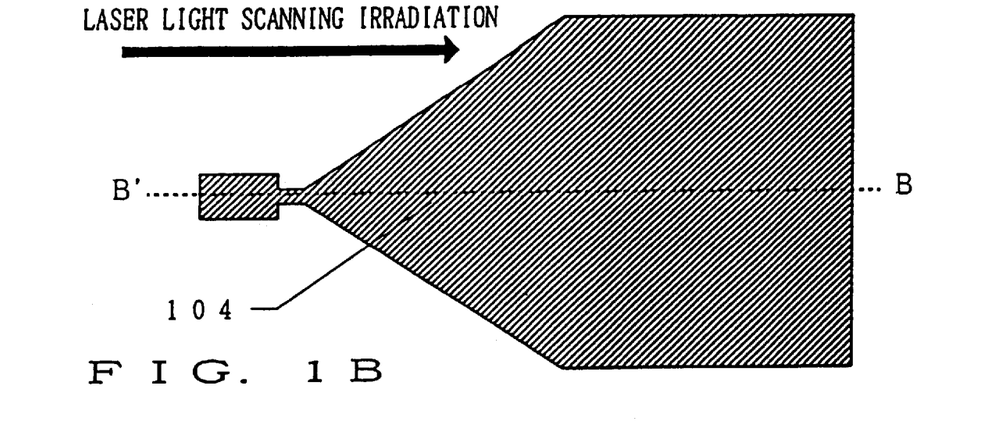

In the above constitution, the step of "forming a region equivalent to a single crystal by irradiating laser light while moving the laser light in the direction for increasing the area of the amorphous silicon film" corresponds to a step in FIG. 1B. In FIG. 1B, a laser light is irradiated while scanning (moving) in a direction of an arrow to sequentially allow the crystals to grow from the region 101 in a direction of an arrow 103 in FIG. 1A, thereby forming a region 104 equivalent to a single crystal. The laser light is, for instance, an excimer laser.

The region equivalent to a single crystal is a region which is free of internal crystal boundaries (line defects and planar defects). That is, the region equivalent to a single crystal is a monodomain region. Since point defects are present in the monodomain regions, the regions contain hydrogen or a halogen element for neutralization at a concentration of $1 \times 10^{17}$ to $5 \times 10^{19}$ cm$^{-3}$.

The metal element for accelerating the crystallization of silicon is also present at a concentration of $1 \times 10^{14}$ to $1 \times 10^{19}$ atoms·cm$^{-3}$. The concentration is defined as a minimum based on the data obtained by SIMS (secondary ion mass spectroscopy). The detection limit of SIMS at present for the metal element is $1 \times 10^{16}$ atoms·cm$^{-3}$. However, the concentration of the metal element can be approximated from the concentration of the metal element in the solution used for introducing the metal element. That is, the concentration beyond the limit of observed value by SIMS can be approximately calculated from the relation between the concentration of the metal element in the solution and the final concentration observed by SIMS for the metal element remaining in silicon film.

The region equivalent to single crystal further contains carbon atoms and nitrogen atoms at a concentration of $1 \times 10^{16}$ to $5 \times 10^{18}$ atoms·cm$^{-3}$ and oxygen atoms at a concentration of $1 \times 10^{17}$ to $5 \times 10^{19}$ atoms·cm$^{-3}$. These atoms originate from the starting amorphous silicon film formed by CVD.

According to another aspect of the present invention, there is provided a method comprising the steps of: forming selectively a layer of a metal element which accelerates the crystallization of silicon in contact with the surface of the amorphous silicon film; applying heat treatment to allow the crystals to grow in the direction of the plane of the film from the region which is in contact with the metal element; patterning the region of crystal growth such that the area gradually increases in the direction of crystal growth; and forming a region equivalent to a single crystal by irradiating a laser light to the amorphous silicon film while moving the laser light in the direction along which the patterned area increases, wherein the laser light is irradiated while heating the amorphous silicon film at 400 to 600° C.

Figure 5A:
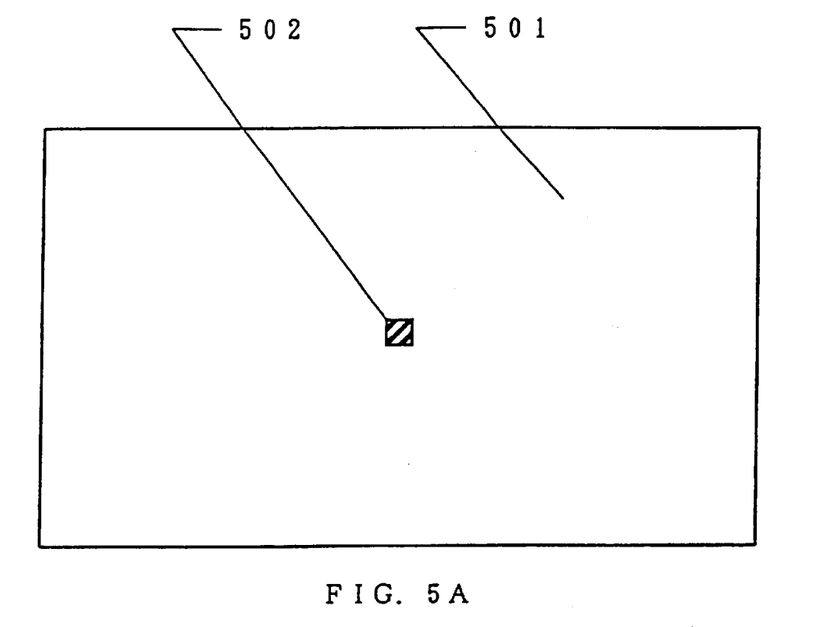
FIGS. 5A and 5B show the steps of crystal growth of a silicon film.
Figure 5B:
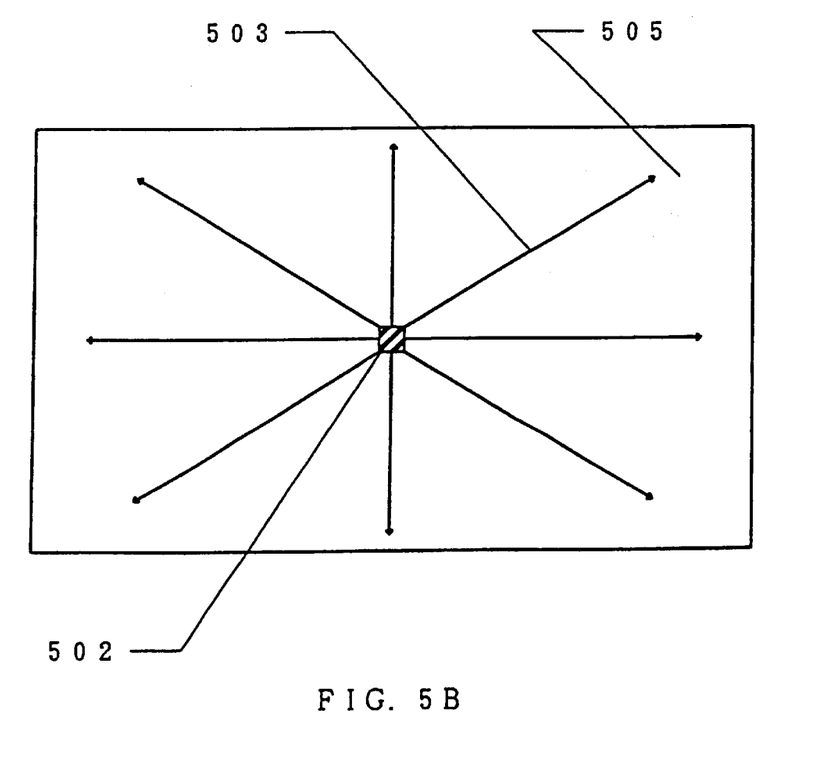

In the above constitution, the step of "applying heat treatment to allow the crystals to grow in the direction of the plane of the film from the region in contact with the metal element" corresponds to a constitution of FIG. 5B. In FIG. 5B, an amorphous silicon film 501 undergoes crystal growth in a direction of the film plane (in a direction parallel to the surface of the substrate on which the film is formed) 503 from a region 502 in which a layer of a metal element as a crystal seed is formed.

Figure 6A:
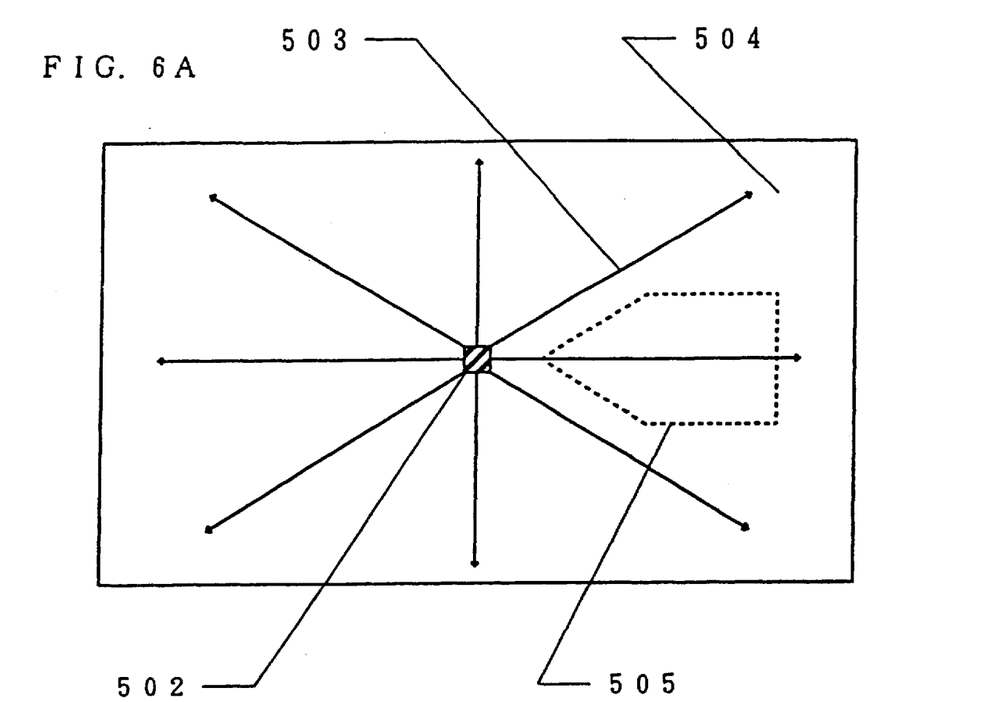
FIGS. 6A and 6B show another steps for manufacturing a region equivalent to single crystal.

In the above constitution, the step of "patterning the region of crystal growth such that the area gradually increases in the direction of crystal growth" corresponds to a step in FIG. 6A. In FIG. 6A, heat treatment is effected such that a pattern having a shape 505 is obtained, such that the area thereof gradually increases in the direction of crystal growth shown with an arrow 503.

Figure 6B:
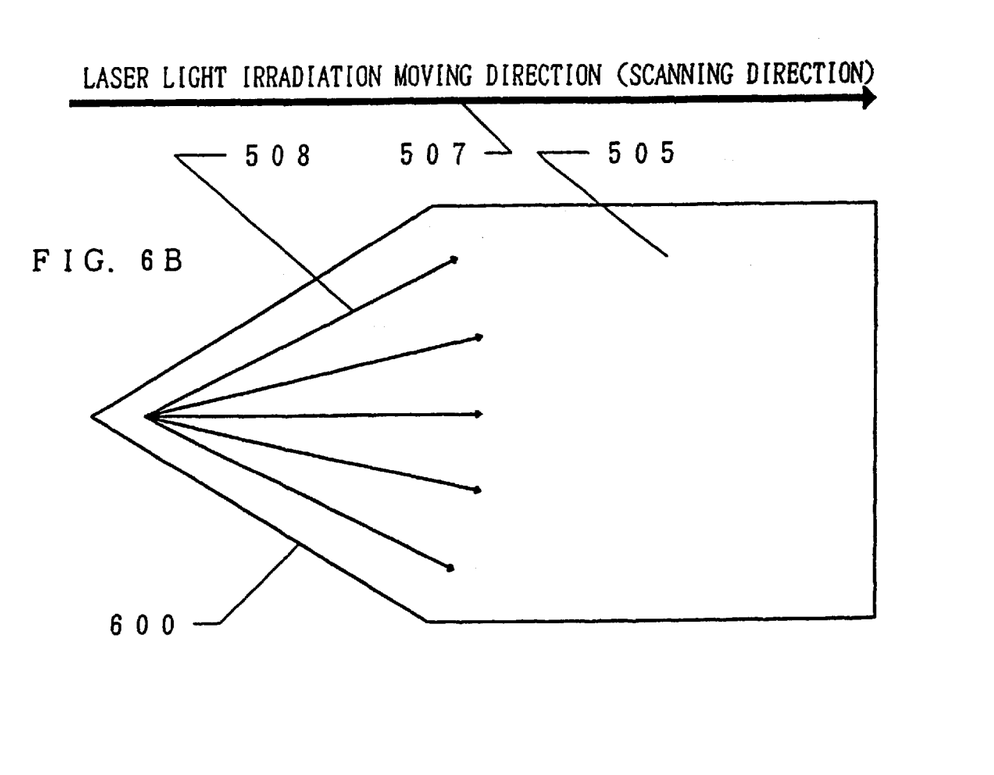

In the above constitution, the step of "forming a region equivalent to a single crystal by irradiating a laser light to the amorphous silicon film while moving the laser light in the direction along which the patterned area increases" corresponds to a step in FIG. 6B. In FIG. 6B, the laser light is scanned and irradiated in a direction of gradually increasing the patterned area 505.

To make a general classification, there are two methods for the introduction of the metal element for accelerating the crystallization.

One of the methods comprises the steps of, forming an extremely thin film of the metal on the surface of the amorphous silicon film (or on the surface of the base film formed under the amorphous silicon film) by a physical method such as sputtering or electron beam vapor deposition. In the above methods, the metal element is incorporated into the amorphous silicon film by forming a film of the metal element in contact with the amorphous silicon film. In this method, it is difficult to precisely control the concentration of the metal element to be introduced into the amorphous silicon film. Moreover, in an attempt to precisely control the quantity of the metal element to be introduced into the film by forming an extremely thin film about several tens of angstroms (Å), it becomes difficult to form a film in a complete form. In this case, island-like film portions of metal element are formed on the surface of the forming surface. That is, a discontinuous layer is formed. This can be overcome by, for example, molecular beam epitaxy (MBE) and the like. However, in practice, MBE is only applicable to a limited area.

In case crystallization is effected after forming the discontinuous layer, each of the island-like regions which constitute the discontinuous layer functions as a nucleus to accelerate the crystallization. By careful observation of the crystalline silicon film obtained by the crystallization from the island-like regions, amorphous components are found to remain in a great number. This can be observed by using an optical microscope or on an electron micrograph. Otherwise, this can be confirmed through the measurements using Raman spectroscopy. It is also confirmed that the metal components remain as aggregates in a crystalline silicon film. The crystalline silicon film is finally used as a semiconductor region, However, when the metal components remain partially as aggregates, these aggregate portions function as recombination centers for electrons and holes in the semiconductor regions. These recombination centers induce particularly undesirable characteristics such as an increase in leak current of the TFT.

In contrast to the physical methods for introducing metal elements mentioned above, there is a chemical method for introducing a metal element for accelerating the crystallization of silicon. This method comprises the steps of, providing the metal element into a solution, and adding the resulting solution to the surface of the amorphous silicon film or to the surface of the base film on which the amorphous silicon film is formed by spin coating and the like. Several types of solution can be used depending on the metal element to be introduced into the amorphous silicon film. Typically, a metal compound available in the form of a solution can be used. Examples of the metal compounds usable in the solution method are shown below.

(1) In nickel (Ni), the nickel compound is at least one selected from the group consisting of nickel bromide, nickel acetate, nickel oxalate, nickel carbonate, nickel chloride, nickel iodide, nickel nitrate, nickel sulfate, nickel formate, nickel oxide, nickel hydroxide, nickel acetyl acetonate, nickel 4-cyclohexylacetate, and nickel 2-ethylhexanate. Nickel may be mixed with a non-polar solvent which is at least one selected from the group consisting of benzene, toluene, xylene, carbon tetrachloride, chloroform, ether, trichloroethylene, and Freon.

(2) When iron (Fe) is used as the catalytic element, an iron salt selected from compounds such as ferrous bromide ($FeBr_2 \cdot 6H_2O$), ferric bromide ($FeBr_3 \cdot 6H_2O$), ferric acetate ($Fe(C_2H_3O_2)_3 \cdot xH_2O$), ferrous chloride ($FeCl_2 \cdot 4H_2O$), ferric chloride ($FeCl_3 \cdot 6H_2O$), ferric fluoride ($FeF_3 \cdot 3H_2O$), ferric nitrate ($Fe(NO_3)_3 \cdot 9_2O$), ferrous phosphate ($Fe(PO_4)_2 \cdot 8H_2O$), and ferric phosphate ($FePO_4 \cdot 2H_2O$) can be used.

(3) In case cobalt (Co) is used as the catalytic element, useful compounds thereof include cobalt salts such as cobalt bromide ($CoBr \cdot 6H_2O$), cobalt acetate ($Co(C_2H_3O_2)_2 \cdot 4_2O$), cobalt chloride ($CoCl_2 \cdot 6H_2O$), cobalt fluoride ($CoF_2 \cdot xH_2O$), and cobalt nitrate ($Co(NO_3)_2 \cdot 6H_2O$).

(4) A compound of ruthenium (Ru) can be used as a catalytic element in the form of a ruthenium salt, such as ruthenium chloride ($RuCl_3 \cdot H_2O$).

(5) A rhodium (Rh) compound is also usable as a catalytic element in the form of a rhodium salt, such as rhodium chloride ($RhCl_3 \cdot 3H_2O$).

(6) A palladium (Pd) compound is also useful as a catalytic element in the form of a palladium salt, such as palladium chloride ($PdCl_2 \cdot 2H_2O$).

(7) In case osmium (Os) is selected as the catalytic element, useful osmium compounds include osmium salts such as osmium chloride ($OsCl_3$).

(8) In case iridium (Ir) is selected as the catalytic element, a compound selected from iridium salts such as iridium trichloride ($IrCl_3 \cdot 3H_2O$) and iridium tetrachloride ($IrCl_4$) can be used.

(9) In case platinum (Pt) is used as the catalytic element, a platinum salt such as platinic chloride ($PtCl_4 \cdot 5H_2O$) can be used as the compound.

(10) In case copper (Cu) is used as the catalytic element, a compound selected from cupric acetate ($Cu(CH_3COO)_2$), cupric chloride ($CuCl_2 \cdot 2H_2O$), and cupric nitrate ($Cu(NO_3)_2 \cdot 3H_2O$) can be used.

(11) In using gold (Au) as the catalytic element, it is incorporated in the form of a compound selected from auric trichloride ($AuCl_3 \cdot xH_2O$) and auric hydrogenchloride ($AuHCl_4 \cdot 4H_2O$).

Each of the above compounds can be sufficiently dispersed in the form of single molecules in a solution. The resulting solution is applied dropwise to the surface on which the catalyst is to be added, and is subjected to spin-coating by rotating at 50 to 500 revolutions per minute (RPM) to spread the solution over the entire surface.

This method using a solution can be considered as a method for forming a film of an organometal compound containing a metal element on the surface of a silicon semiconductor. The metal element which accelerates the crystallization of silicon is allowed to diffuse into the semiconductor in the form of atoms through the oxide film. In this manner, they can be diffused without positively forming crystal nucleus, and thereby provides a uniformly crystallized silicon film. As a result, the metal element can be prevented from being partially concentrated or the amorphous component can be prevented from remaining in a large quantity.

The silicon semiconductor can be uniformly coated with an organometal compound, and then ozone treatment (i.e., treatment using ultraviolet radiation (UV) in oxygen) may be performed. In such a case, a metal oxide film is formed, and the crystallization proceeds from the metal oxide film. Thus, the organic matter can be favorably oxidized and removed by volatilization in gaseous carbon dioxide.

In case spin coating of the solution is effected by rotating at a low speed only, the metal component that is present in the solution on the surface tends to be supplied onto the semiconductor film at a quantity more than is necessary for the solid phase growth. Thus, after rotating at a low revolution rate, the spin coating is effected by rotating the substrate at 1,000 to 10,000 RPM, typically, 2,000 to 5,000 RPM. The organometal compound that is present in excess can be spun off by rotating at high rate, so that the metal component can be supplied at an optimum quantity.

The quantity of the metal component to be introduced into the silicon semiconductor can be adjusted by controlling the concentration of the metal component in the solution. This method is particularly useful, because the concentration of the metal element to be finally introduced into the silicon film can be accurately controlled. In the method of introducing the metal element using the solution, a continuous layer can be formed on the surface of the semiconductor (or on the surface of the undercoating thereof) without forming island-like regions of metal particles for the crystallization. Then, a uniform and dense crystal growth can be effected by a crystallization method with heat treatment or with irradiation of laser light.

In the foregoing, an example of using a solution has been described, but a similar effect as the one above can be obtained by forming the film by CVD using a gaseous metal compound, and particularly, a gaseous organometal compound. However, this method using CVD is disadvantageous in that it is not as simple as the one using a solution.

The method for forming the layer by sputtering and the like as described above can be denoted as a physical method. The method using a solution in forming a layer containing a metal element for accelerating the crystallization of amorphous silicon can be considered as a chemical method. The physical method can be considered as a non-uniform anisotropic crystal growth method using metal elements, whereas the chemical method can be considered as a method for uniform (isotropic) crystal growth.

In the method for manufacturing a semiconductor as described above, the laser light is irradiated in a direction of gradually increasing the area of a region in which the seeds of crystal growth are formed. In this manner, a uniform crystal growth can be effected to form a region equivalent to a single crystal.

Further, the laser light is irradiated to the amorphous silicon film which is patterned such that the area gradually increases from the region in which the seeds of crystal growth are formed to accelerate the crystallization while heating and scanning the laser light in a direction for increasing the area of the amorphous silicon film. In this manner, a uniform crystal growth can be effected to form a region equivalent to a single crystal.

Also, by patterning a silicon film obtained by crystal growth in a direction in parallel with the substrate in such a manner that the area thereof gradually increases, and further by irradiating a laser light while heating and scanning it in a direction of gradually increasing the area of the patterned film, a region equivalent to a single crystal can be obtained, because the crystal growth is allowed to occur in a single mode.

DETAILED DESCRIPTION OF THE PREFERRED EMBODIMENTS

EXAMPLE 1

Figure 1C:
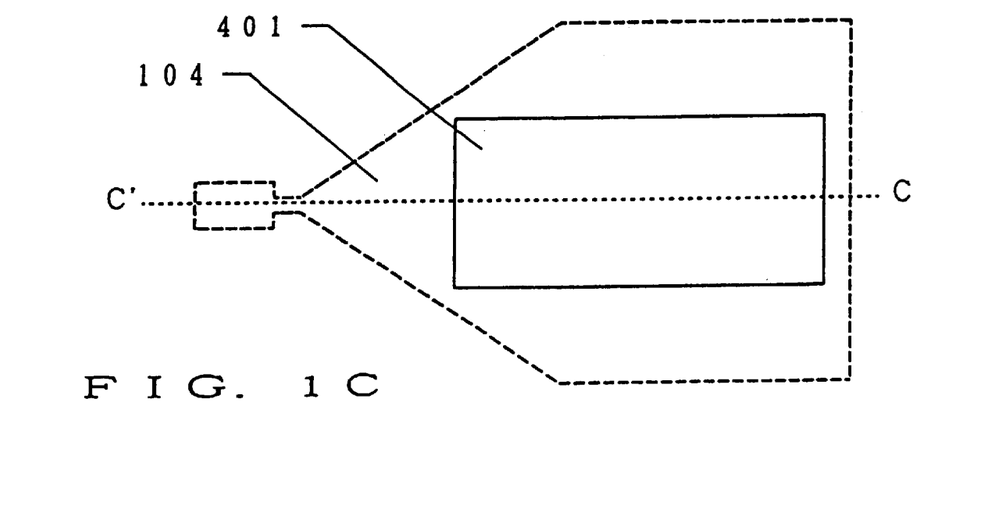

The present example refers to a case of forming a region equivalent to a single crystal from an amorphous silicon film formed on a glass substrate. The steps for the example are shown in FIGS. 1A to 1C and in FIGS. 3A to 3E.

Figure 3A:
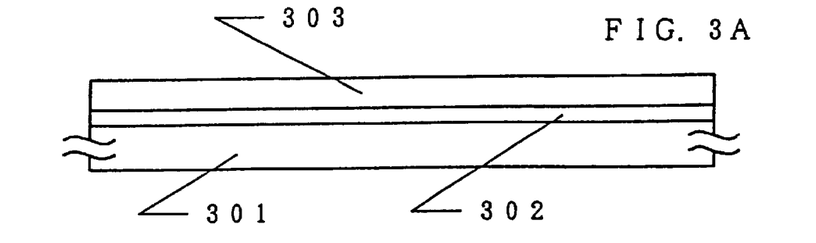
FIGS. 3A to 3E show steps for manufacturing a region equivalent to single crystal.

After forming a silicon oxide film 302 at a thickness of 3,000 Å by sputtering or plasma CVD as a base film on a glass substrate 301, an amorphous silicon film 303 is formed at a thickness of 500 Å by plasma CVD or low pressure thermal CVD (FIG. 3A).

Figure 3B:
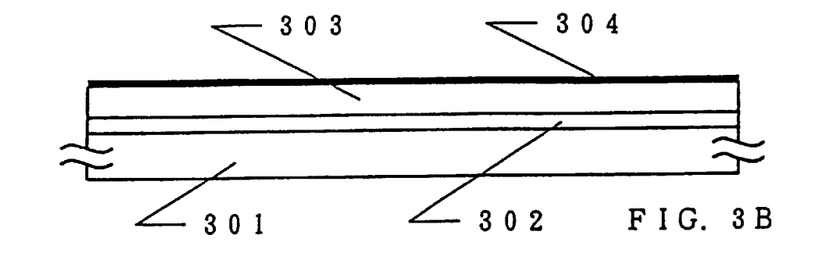

A nickel silicide layer 304 is formed by spin coating with a solution (nickel acetate solution) containing nickel as the metal element which accelerates (promotes) the crystallization of silicon and by heat treating the coated structure at 300 to 500° C. (400° C. in this case) for 1 hour (FIG. 3B).

Figure 3C:
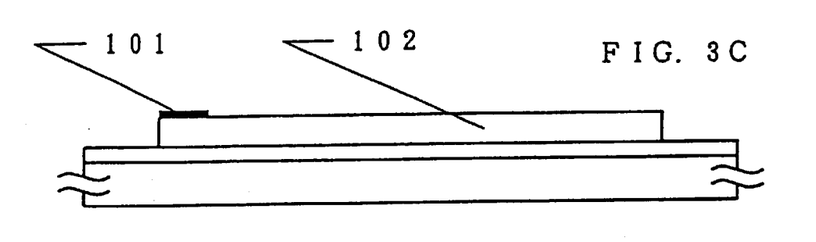
Figure 3D:
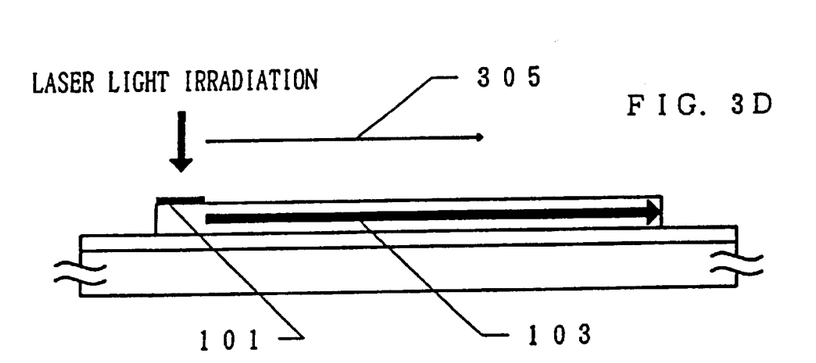

The nickel silicide layer 304 is selectively patterned using a fluorine-based enchant (e.g., a buffered hydrofluoric acid) to form island-like nickel silicide layer 101. The amorphous silicon film 303 is patterned to obtain a state in FIG. 1A. FIG. 3C shows a cross sectional view taken along A–A' in FIG. IA. The angle θ indicated by 100 in FIG. 1A is preferably 90 degrees or less. The patterned amorphous silicon film 303 results in a shape 102 shown in FIG. 1A. In one end thereof is formed an island-like nickel silicide layer 101.

Figure 3E:
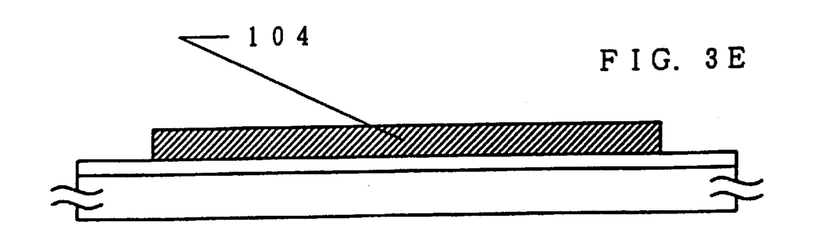

A KrF excimer laser light is irradiated while moving the laser in the direction 305. The laser light is shaped into a linear beam whose longitudinal direction corresponds to a direction vertical to the scanning direction. By irradiating a laser light, crystal growth occurs from the region in which the nickel silicide layer 101 is formed in a direction of an arrow 103. The point in this method is that the specimen is heated in 400 to 600° C. during irradiation of the laser light. In this manner, a region equivalent to a single crystal (a monodomain region) 104 is obtained as shown in FIG. 3E. FIG. 3E corresponds to a cross sectional view taken in B–B' shown in FIG. 1B.

EXAMPLE 2

Figure 4A:
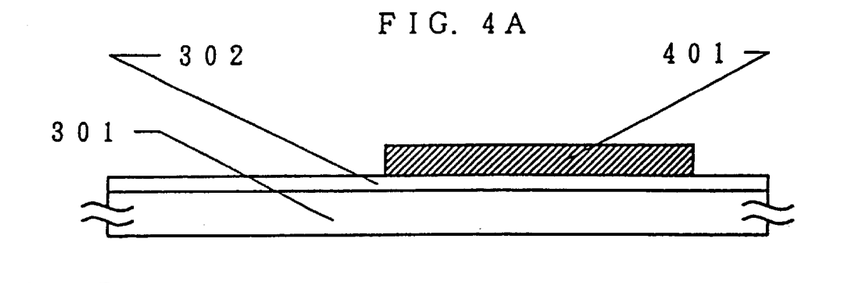
FIGS. 4A to 4D show steps for manufacturing a thin film transistor.

The present example refers to a method for manufacturing a thin film transistor (TFT) using a region equivalent to single crystal 104 as shown in FIGS. 3A to 3E. In FIGS. 4A to 4D, the method for producing a TFT according to the example is described. In FIG. 1C and FIG. 4A, the region equivalent to a single crystal 104 is patterned to form an active layer 401 for the TFT.

Figure 4B:
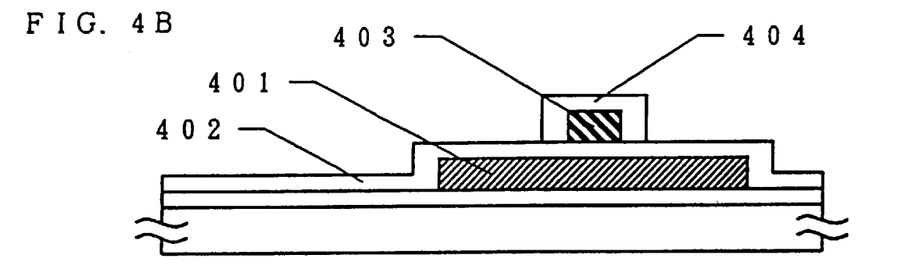

The cross sectional view taken along C–C' in FIG. 1C is given in FIG. 4A. In FIG. 4B, a silicon oxide film 402 is formed at a thickness of 1,000 Å to provide a gate insulating film which covers the active layer 401. Then, a film based on aluminum and containing scandium is formed at a thickness of 7,000 Å by electron beam vapor deposition, and the resulting film is patterned to form a gate electrode 403. After forming the gate electrode 403, anodic oxidation is effected in an electrolytic solution using the gate electrode 403 as the anode, to from an oxide layer 404 (FIG. 4B).

Figure 4C:
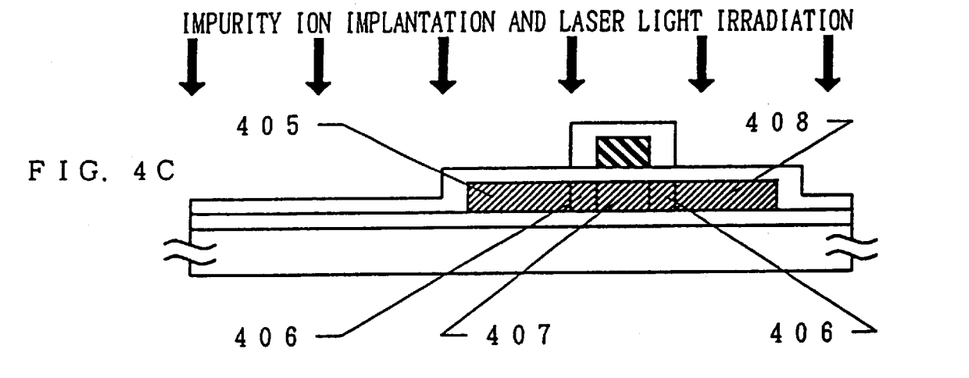

An impurity region is formed by doping an impurity ion (phosphorus ion in this example). Thus, phosphorus ions are implanted into regions 405 and 408 using the gate electrode 403 and the surrounding oxide layer 404 as masks. The regions 405 and 408 are used as a source region and a drain region, respectively. In this step, a channel forming region 407 and an offset gate region 406 are formed in a self-alignment (FIG. 4C).

Figure 4D:
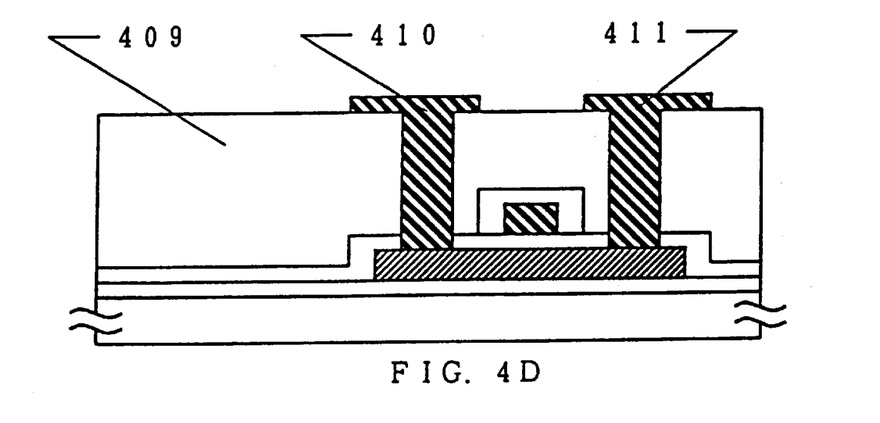

A silicon oxide film is formed to a thickness of 6,000 Å as an interlayer insulating film 409 by plasma CVD. After forming contact holes, a source electrode 410 and a drain electrode 411 are formed by using aluminum. By finally effecting hydrogenation by heat treatment in hydrogen atmosphere at 350° C., a TFT in FIG. 4D is obtained.

EXAMPLE 3

The present example refers to a method of forming a region equivalent to a single crystal (a monodomain region) by heating and allowing crystal growth to occur by utilizing a metal element which accelerates the crystallization of silicon, and further irradiating a laser light to the crystallized region. The steps for the present example are shown in FIGS. 5A and 5B and in FIGS. 6A and 6B. An amorphous silicon film (not shown in the figure) is formed to a thickness of 500 Å by plasma CVD or low pressure thermal CVD. Although not shown in the figure, a glass substrate having a silicon oxide film formed on the surface thereof is used as the substrate.

A nickel layer or a layer containing nickel is formed by adding the substrate to a nickel acetate solution. The resulting substrate is patterned to form a region 502 (a square region with a length of 3 μm). By thermal treatment at 550° C. for 4 hours, the region 502 is crystallized to provide the seeds for crystal growth. Since the region 502 is a small region, it can be converted by this treatment into a region equivalent to a single crystal.

An amorphous silicon film 501 is formed to cover the region 502. It is realized that a layer 502 containing a metal element (nickel in this case) which accelerates the crystallization of silicon is in contact with a part of the amorphous silicon film 501.

By heat treatment in 400 to 600° C. (550° C. in this example) for 4 hours, crystal growth proceeds two dimensionally from the region 502 as the seed of crystal growth. Microscopically, the crystals grow into those of acicular or columnar shape because the crystal growth occurs two dimensionally in a direction parallel with the substrate. Thus, a crystalline silicon film 504 is obtained. The crystal growth 503 occurs over a length of 100 μm or even longer. Further, since the heating temperature necessary for the crystal growth is 600° C. or lower, an inexpensive glass substrate having a low deformation point can be used.

After the step of crystal growth in FIG. 5B, the crystalline silicon film 504 is patterned into a pattern 505 shown in FIG. 6A. An enlarged view for the pattern 505 in FIG. 6A is given in FIG. 6B. Crystal growth 508 proceeds as a linear laser light is irradiated while scanning it in a direction of an arrow 507. The specimen is heated to 550° C. during the scanning of the laser light. The laser light is a KrF excimer laser having a line beam in a direction perpendicular to the scanning direction. The laser light having a line beam is a rectangular beam spot having several millimeters in width and several tens of centimeters in length, with the longitudinal direction provided perpendicular to the moving direction of laser light.

The crystal growth 508 does not occur simultaneously in a plurality of places, but occurs sequentially in the direction of the arrow 508, i.e., in the same direction of crystal growth in parallel with the substrate according to the step of FIG. 5B. Accordingly, crystal growth occurs in a single mode. Further, since the crystalline silicon film 505 is formed in such a pattern that the area thereof gradually increases in accordance with the direction of crystal growth, a uniform crystal growth can be implemented to finally obtain a large single domain (crystal grain). The fact that the sides 509 are provided approximately along the direction of crystal growth is an important factor for realizing a large single domain, because the edges 509 of the pattern provides the starting points for suppressing the crystal growth. Accordingly, the pattern 505 provides relatively easily a region equivalent to a single crystal.

The method according to the present example comprises steps of crystallizing the amorphous silicon film by heating and utilizing the function of a metal element which accelerates the crystallization of silicon, and patterning the heated and crystallized silicon film in such a manner that the crystal growth proceeds smoothly in the direction of crystallization. Further, laser light is irradiated along the desired direction of crystal growth while heating. In this manner, the patterned region is converted into a region equivalent to a single crystal.

EXAMPLE 4

The present example relates to the shape of the patterns of a region equivalent to a single crystal (monodomain region) 102 and 505 shown in FIG. 1A and FIG. 6B. The patterns of the regions 102 and 505 are characterized in that the area thereof gradually increases in the direction of crystal growth. The particular patterns are provided to prevent crystal growth from occurring from a plurality of regions during crystal growth. If crystal growth proceeds from a plurality of regions, the growing crystals collide with each other to form grain boundaries. In other words, a uniform crystal growth can be effected by gradually extending the crystal growth from a single starting point; that is, the crystal growth is effected unimodal to form a region equivalent to a single crystal.

A uniform crystal growth can be effected by initiating crystal growth from a starting point, and gradually enlarging the region of crystal growth. In FIGS. 1A and 6B, the area of crystal growth gradually increases from the starting point of crystal growth for a desired distance from the starting point, and the area is maintained constant in the region exceeding the desired distance.

Figure 7A:
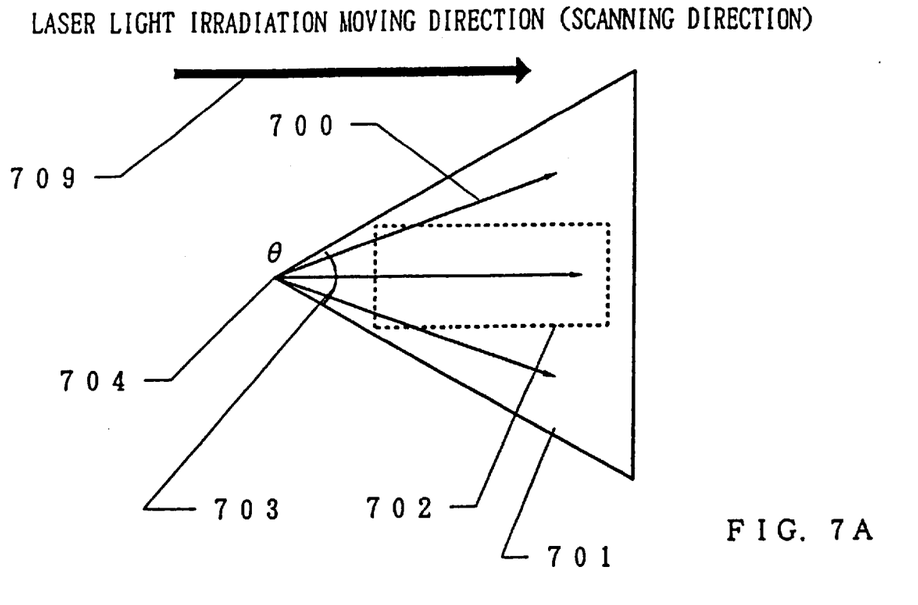
FIGS. 7A and 7B show another steps for manufacturing a region equivalent to single crystal.
Figure 7B:
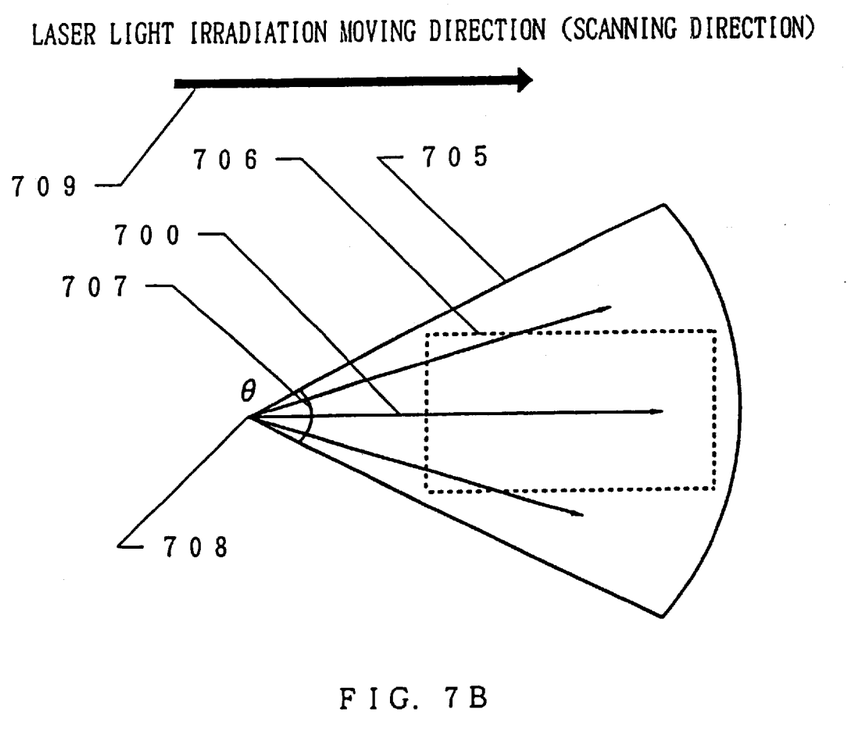

However, a region equivalent to a single crystal can be formed by using an amorphous silicon film or a crystalline silicon film formed into a pattern as illustrated in FIGS. 7A and 7B. When the amorphous silicon film is patterned into a shape as illustrated in FIG. 7A, a layer of a metal element such as nickel which accelerates the crystallization of silicon or a layer containing the metal element is provided in contact with the region 704, and a laser light is scanned in the direction 705 and irradiated to allow crystals to grow from the region 704 in the direction of an arrow 700. Preferably, a laser light having a linear beam spot whose longitudinal direction is perpendicular to the scanning direction is used.

Further, crystal growth is allowed to proceed from the region 704 in the direction 700 by heating an utilizing the function of the metal element, and after patterning the crystallized region into the shape 701, laser light is irradiated while moving it in the direction 705 (with heating). Also in this manner, the crystals are allowed to grow again to obtain a region 701 equivalent to a single crystal. The crystal growth which occurs in the direction 700 by the heat treatment provides acicular or columnar crystals, and does not provide a region equivalent to a single crystal. More briefly, the crystal growth achieved by the heat treatment produces grain boundaries. However, the crystal growth effected by using the laser light irradiated while moving the laser in the direction 705 produces a uniform crystal growth (unimodal crystal growth) from the starting point 704, and it finally forms a monodomain region, i.e., a region equivalent to a single crystal. Further, by forming a region 702 after patterning, for instance, a region constituting the active layer of a TFT can be obtained.

By using the pattern in FIG. 7B, it is also possible to perform crystal growth in a manner similar to the case of FIG. 7A. That is, in FIG. 7B, the amorphous silicon film is patterned into the shape 706, and after providing the metal element for accelerating the crystallization of silicon in contact with the portion 708, a laser light is irradiated while moving it in the direction 709. In this manner, crystal growth can be effected uniformly in the direction 710 from the region 708 provided as the starting point, so that a region 706 equivalent to a single crystal can be finally obtained. Also, by forming a region 707 after patterning, for instance, a region constituting the active layer of a TFT can be obtained.

The angles 703 and 711 are preferably 90 degrees or less. If the angle is greater than 90 degrees, the crystal growth which occurs from the edges of the pattern 701 or 706 becomes prominent as to effect a crystal growth in plural modes. Monodomain region cannot be obtained from a crystal growth which occurs in a plurality of modes, because such a crystal growth results in the formation of plural domains.

EXAMPLE 5

The present example relates to a method for accelerating the hydrogenation (desorption of hydrogen) of amorphous silicon film by plasma treatment to the film. In this manner, the crystallization of the amorphous silicon film is accelerated. In the step of FIG. 3A, plasma treatment using a plasma of hydrogen or helium is performed to the amorphous silicon film. This step utilizes the ECR condition to obtain a plasma of gaseous hydrogen or gaseous helium under a reduced pressure, and the amorphous silicon film is exposed to the resulting hydrogen plasma.

It is important to heat the amorphous silicon film at a temperature not higher than the crystallization temperature thereof. The crystallization temperature of the amorphous silicon film differs depending on the method of film formation and the film formation conditions, however, in general, it is 600 to 650° C. The lower limit thereof is about 400° C. Accordingly, the heating temperature is preferably 400 to 600° C. It is also useful to use the deformation temperature of the glass substrate as a standard for determining the upper limit of the heating temperature. That is, the heat treatment is effected at a temperature as high as possible, but at such not exceeding the upper limit determined from the deformation temperature of the glass substrate. By using this method, a desired effect can be obtained while suppressing the influence of deformation or shrinking of the glass substrate.

In the treatment using hydrogen plasma, hydrogen that is present in the amorphous silicon film combines with the hydrogen ions of the plasma to generate gaseous hydrogen. Thus, the desorption of hydrogen from the film is accelerated. By effecting plasma treatment using helium, the bond between hydrogen and silicon inside the amorphous silicon film can be cut by helium ions that collide with the bond. Thus, the bonding of silicon atoms with each other becomes accelerated to result in a state of higher ordering degree in atom arrangement. This state can be denoted as a quasi-crystalline state which is extremely liable to crystallization.

An amorphous silicon film can be crystallized by applying an energy by heating or irradiating a laser light with a plasma-treated state. Since the amorphous silicon film after the plasma treatment is extremely liable to crystallization, the crystallization can be effected with high reproducibility and results in a film with high crystallinity.

EXAMPLE 6

The present example refers to a method which comprises the steps of, forming a portion as a seed of crystal growth on one edge of an amorphous silicon film formed on a glass substrate, and crystallizing the entire surface of the amorphous silicon film from the portion by scanning and irradiating a laser light.

Figure 8:
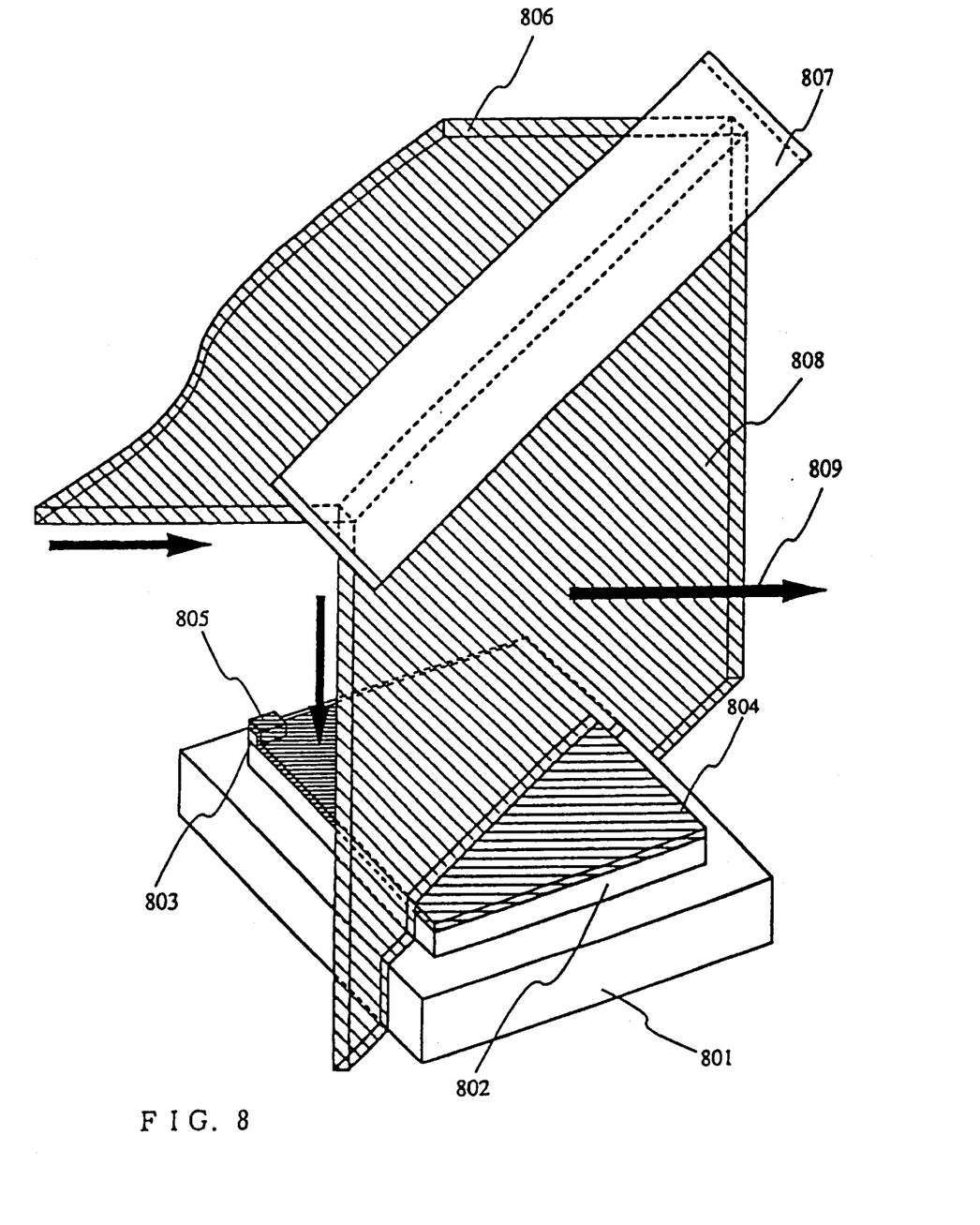
FIG. 8 shows a state of irradiating a laser light and thereby crystallizing an island-like active layer region obtained by patterning of an amorphous silicon film.

The crystallization step according to the example is shown schematically in FIG. 8. In FIG. 8, a stage 801 for mounting a glass substrate 802 thereon is provided freely movable in a direction opposite to that of an arrow 809. That is, by moving the stage 801, laser light is relatively scanned in a direction of the arrow 809 to irradiate the glass substrate 802. A built-in heater inside the stage 801 heats the glass substrate 802 mounted on the stage to a desired temperature. The portion 803 is formed by using a nickel element, and provides a seed for crystal growth. The method for forming the portion 803 which functions as a seed of crystal growth is described below.

The amorphous silicon film 804 is formed to cover the portion 803 which functions as a seed for crystal growth. In FIG. 8, a linear laser light 808 is irradiated to the amorphous silicon film 804 by relatively scanning the light 808 in a direction of the arrow 809. A linear laser light 806 irradiated from a laser irradiation source (not shown) is reflected by a mirror 807 to provide the laser light 808 bent approximately in a direction perpendicular to the stage 801, and is irradiated to the amorphous silicon film 804. By moving the stage 801 in a direction opposite to that of the arrow 809 while irradiating the laser light 808, the laser light can be relatively scanned in a direction of the arrow 809. The laser light is irradiated while heating the glass substrate 802 in 400 to 600° C., for instance, 500° C., by using a heater provided to the stage 801.

By irradiating a laser light to a structure in FIG. 8, crystallization proceeds from the portion 805 of the amorphous silicon film provided on the portion 803 in which seeds for crystal growth are formed. Since the laser beam is scanned in a direction approximately in parallel with the diagonal of the glass substrate 802, the crystal growth proceeds in a direction along which the area of the amorphous silicon film 804 gradually increases. In this manner, the amorphous silicon film 804 can be entirely converted into a structure which can be regarded as a monodomain region.

The method of forming a portion 803 which provides a seed of crystal growth is described below. After forming an amorphous silicon film 804 by plasma CVD or low pressure thermal CVD, the amorphous silicon film 804 is patterned to provide a pattern (indicated by 803 in the figure) which functions as a nucleus of crystal growth. After maintaining nickel element in contact with the surface of the pattern by spin coating, heat treatment is applied thereto for the crystallization to form a portion 803 which provides the seed for crystal growth. A specimen as shown in FIG. 8 is obtained by forming an amorphous silicon film 804 to cover the portion 803 provided as the seed of crystal growth.

EXAMPLE 7

Figure 9:
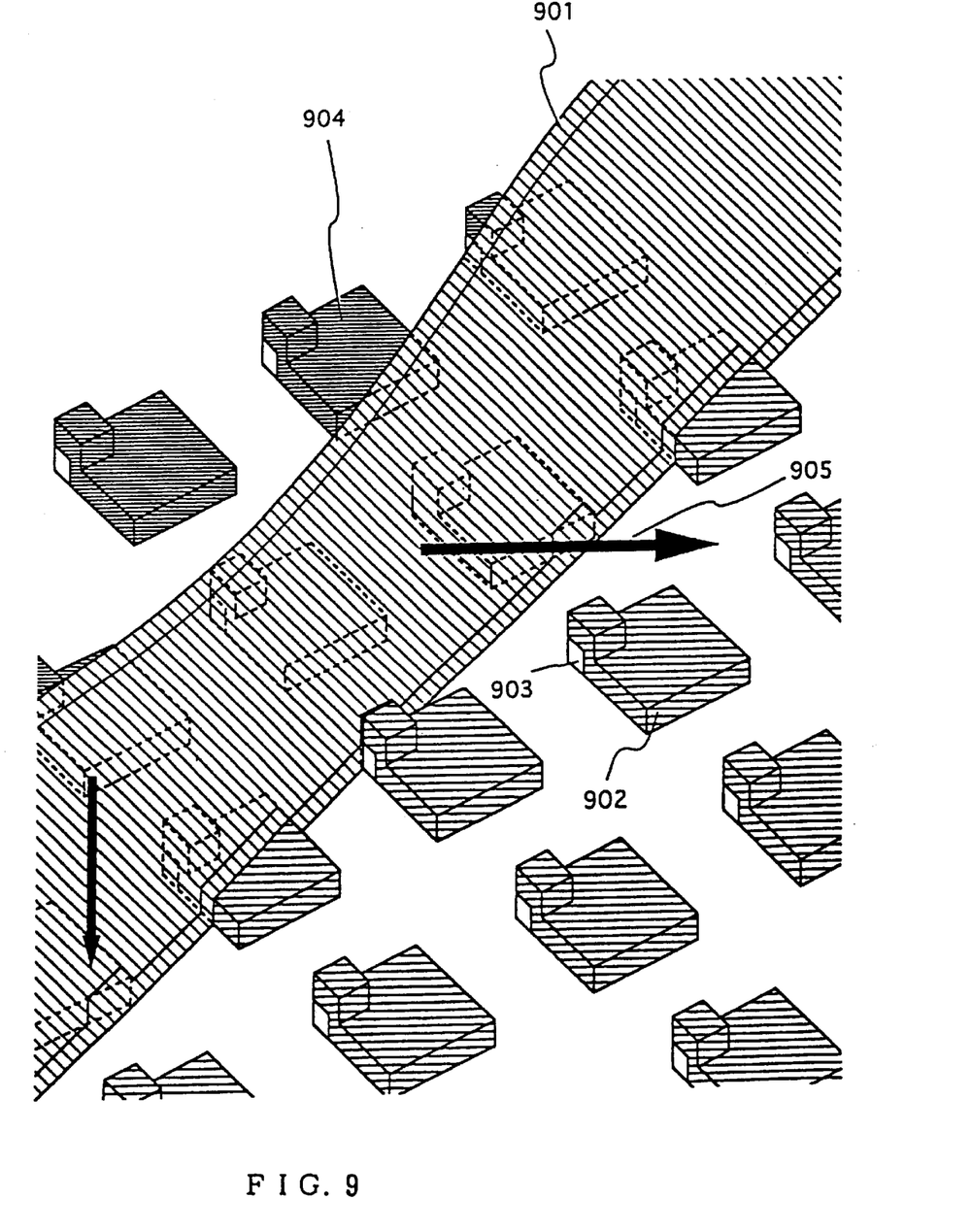

The present example relates to a method comprising the steps of, forming an active layer constituting a TFT, and providing a region equivalent to a single crystal by allowing crystal growth to occur from the corner of the active layer. FIG. 9 shows a crystallized state of an island-like region (active layer) obtained by patterning an amorphous silicon film and irradiating laser light thereto.

A linear laser light 901 is irradiated to an island-like patterned amorphous silicon film 902. A portion 903 provides a seed for crystal growth. The portion 903 can be formed by any method described in the foregoing examples. In FIG. 9, the laser light is irradiated by relatively scanning the light in the direction of an arrow 905 to allow the crystal growth to occur from the corner portion of the island-like region 902. Thus, an active layer for a TFT comprising a region equivalent to a single crystal is formed. The active layer 904 is converted into a region equivalent to a single crystal.

In irradiating a laser light, a portion 903 which functions as a seed for crystal growth is provided previously so that the laser light 901 is scanned approximately in the direction of the diagonal from the portion 903. In this manner, the crystal growth can be proceeded from the portion 903 provided as the seed of crystal growth and in the direction of gradually increasing the crystallized area to finally obtain the entire active layer as a region equivalent to a single crystal. Preferably, the portion 903 provided as the seed of crystal growth is removed by etching upon completion of the crystallization.

In the method of forming a region equivalent to a single crystal by irradiating a laser light to a silicon film, the crystal growth from a plurality of regions which hinders the formation of a region equivalent to a single crystal can be prevented from occurring by designing a pattern for forming the region equivalent to a single crystal and by allowing the crystal growth to occur in a pattern which gradually increases the crystallized area from a starting point of the crystal growth. Thus, a region equivalent to a single crystal can be readily obtained in this manner. Accordingly, a TFT free from the influence of grain boundaries can be implemented by utilizing the monodomain regions in the constitution of the TFT. Further, a TFT having a high withstand voltage and also capable of operating a large current can be obtained. The present invention also provides a TFT free of degradation and fluctuation in characteristics. A TFT having characteristics well comparable to those of a TFT utilizing a single crystal semiconductor can be realized.

What is claimed is:

1. A method for producing a semiconductor device comprising the steps of:

selectively forming a layer including a metal element in contact with an amorphous semiconductor film comprising silicon;

patterning the amorphous semiconductor film to increase an area from a portion of the amorphous semiconductor film which is in contact with the layer including the metal element; and irradiating the amorphous semiconductor film with a laser light while moving the laser light to a direction in which the area increases to crystallize said amorphous semiconductor film.

2. The method of claim 1 where in the metal element is selected from the group consisting of Fe, Co, Ni, Ru, Rh, Pd, Os, Ir, and Pt.

3. The method of claim 1 wherein a concentration of the metal element in the crystallized semiconductor film is not higher than $1 \times 10^{19}$ cm$^{-3}$.

4. The method of claim 1 wherein the crystallized semiconductor film includes hydrogen or halogen element at a concentration of $1 \times 10^{17}$ cm$^{-3}$ to $5 \times 10^{19}$ cm$^{-3}$.

5. A method for producing a semiconductor device comprising the steps of:

selectively forming a layer including a metal element in contact with an amorphous semiconductor film comprising silicon;

performing crystal growth from a portion of the amorphous semiconductor film which is in contact with the layer including the metal element in a film surface direction by heating;

patterning the crystallized semiconductor film wherein an area of the patterned semiconductor film increases in a direction of the crystal growth; and irradiating the patterned semiconductor film with a laser light while moving the laser light to a direction in which the area increases.

6. The method of claim 5 wherein the metal element is selected from the group consisting of Fe, Co, Ni, Ru, Rh, Pd, Os, Ir, and Pt.

7. The method of claim 5 wherein a concentration of the metal element in the crystallized semiconductor film is not higher than $1 \times 10^{19}$ cm$^{-3}$.

8. The method of claim 5 wherein the crystallized semiconductor film includes hydrogen or halogen element at a concentration of $1 \times 10^{17}$ cm$^{-3}$ to $5 \times 10^{19}$ cm$^{-3}$.

9. A method of fabricating a semiconductor device comprising:

forming a semiconductor film comprising amorphous silicon on an insulating surface;

patterning said semiconductor film to form a patterned semiconductor film;

irradiating a corner portion of said amorphous semiconductor film with a line-shaped laser beam; and moving a relative position of said patterned semiconductor film with respect to said line-shaped laser beam from said corner in such a direction that an irradiation area of the laser beam to said patterned semiconductor film increases, thereby, crystallize said patterned semiconductor film.

10. The method according to claim 9 further comprising a step of patterning the crystallized semiconductor film to form an active layer of a TFT.

11. The method according to claim 9 wherein the semiconductor film is heated at 400 to 600° C. during the irradiation of said laser beam.

12. A method of fabricating a semiconductor device comprising:

forming a semiconductor film comprising amorphous silicon on an insulating surface;

patterning said semiconductor film to form a patterned semiconductor film wherein a corner portion of said patterned semiconductor film is provided with a metal containing material for promoting crystallization of the semiconductor film;

irradiating said corner portion of said amorphous semiconductor film with a line-shaped laser beam; and moving a relative position of said patterned semiconductor film with respect to said line-shaped laser beam from said corner in such a direction that an irradiation area of the laser beam to said patterned semiconductor film increases, thereby, crystallize said patterned semiconductor film.

13. The method according to claim 11 further comprising a step of patterning the crystallized semiconductor film to form an active layer of a TFT.

14. The method according to claim 11 wherein a the semiconductor film is heated at 400 to 600° C. during the irradiation of said laser beam.

15. A method of fabricating a semiconductor device comprising:

forming a semiconductor film comprising amorphous silicon on an insulating surface;

crystallizing said semiconductor film by heating;

patterning said semiconductor film after crystallizing said semiconductor film to form a patterned semiconductor film;

irradiating a corner portion of said amorphous semiconductor film with a line-shaped laser beam; and moving a relative position of said patterned semiconductor film with respect to said line-shaped laser beam from said corner in such a direction that an irradiation area of the laser beam to said patterned semiconductor film increases.

16. The method according to claim 15 further comprising a step of patterning the patterned semiconductor film after the irradiation of the laser beam to form an active layer of a TFT.

17. The method according to claim 15 wherein the semiconductor film is heated at 400 to 600° C. during the irradiation of said laser beam.

18. A method of fabricating a semiconductor device comprising:

forming a semiconductor film comprising amorphous silicon on an insulating surface;

providing said semiconductor film with a metal containing material for promoting crystallization of said semiconductor film;

crystallizing said semiconductor film by heating;

patterning said semiconductor film after crystallizing said semiconductor film to form a patterned semiconductor film;

irradiating a corner portion of said patterned semiconductor film with a line-shaped laser beam; and moving a relative position of said patterned semiconductor film with respect to said line-shaped laser beam from said corner in such a direction that an irradiation area of the laser beam to said patterned semiconductor film increases.

19. The method according to claim 18 further comprising a step of patterning the patterned semiconductor film after the irradiation of the laser beam to form an active layer of a TFT.

20. The method according to claim 18 wherein the semiconductor film is heated at 400 to 600° C. during the irradiation of said laser beam.

* * * * *